(12) United States Patent
Fukuzumi

(10) Patent No.: US 9,818,754 B2
(45) Date of Patent: Nov. 14, 2017

(54) SEMICONDUCTOR MEMORY DEVICE AND METHOD FOR MANUFACTURING SAME

(71) Applicant: Toshiba Memory Corporation, Minato-ku (JP)

(72) Inventor: Yoshiaki Fukuzumi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/264,086

(22) Filed: Sep. 13, 2016

(65) Prior Publication Data

US 2017/0271347 A1 Sep. 21, 2017

Related U.S. Application Data

(60) Provisional application No. 62/308,550, filed on Mar. 15, 2016.

(51) Int. Cl.
*H01L 29/792* (2006.01)
*H01L 27/11556* (2017.01)
*H01L 27/11519* (2017.01)

(52) U.S. Cl.
CPC .. *H01L 27/11556* (2013.01); *H01L 27/11519* (2013.01)

(58) Field of Classification Search
CPC .............. H01L 27/11556; H01L 27/11519
See application file for complete search history.

(56) References Cited

U.S. PATENT DOCUMENTS

| 7,539,056 | B2 | 5/2009 | Katsumata et al. |
| 8,013,383 | B2 | 9/2011 | Kidoh et al. |
| 8,048,798 | B2 | 11/2011 | Kidoh et al. |
| 8,344,385 | B2 | 1/2013 | Kim et al. |
| 8,551,838 | B2 | 10/2013 | Kito et al. |
| 8,729,624 | B2 | 5/2014 | Fukuzumi et al. |
| 9,236,395 | B1 | 1/2016 | Sasaki |
| 9,431,419 | B2 | 8/2016 | Fukuzumi et al. |
| 2009/0310425 | A1* | 12/2009 | Sim ................ H01L 27/11526 365/185.29 |

(Continued)

FOREIGN PATENT DOCUMENTS

| JP | 2008-192708 | 8/2008 |
| JP | 2009-146954 | 7/2009 |

(Continued)

*Primary Examiner* — Victor A Mandala
(74) *Attorney, Agent, or Firm* — Oblon, McClelland, Maier & Neustadt, L.L.P.

(57) ABSTRACT

According to one embodiment, a semiconductor memory device includes a substrate, a stacked body, and a columnar portion. The stacked body includes a first insulating layer provided on the substrate, a first electrode layer provided on the first insulating layer and including polycrystalline silicon, a second insulating layer provided on the first electrode layer, and a second electrode layer provided on the second insulating layer. The columnar portion includes a semiconductor layer extending in a stacking direction of the stacked body and a memory layer provided between the semiconductor layer and the stacked body. The first and second electrode layers respectively have a first thickness and a second thickness in the stacking direction, and the first thickness of the first electrode layer is thicker than the second thickness of the second electrode layer.

14 Claims, 15 Drawing Sheets

(56) References Cited

U.S. PATENT DOCUMENTS

| | | |
|---|---|---|
| 2010/0207195 A1 | 8/2010 | Fukuzumi et al. |
| 2012/0168858 A1 | 7/2012 | Hong |
| 2012/0181602 A1 | 7/2012 | Fukuzumi et al. |
| 2013/0126961 A1 | 5/2013 | Fukuzumi et al. |
| 2014/0217493 A1 | 8/2014 | Fukuzumi et al. |
| 2015/0060992 A1* | 3/2015 | Taekyung ............ H01L 29/7926 257/324 |
| 2015/0064885 A1* | 3/2015 | Lee ................... H01L 27/11556 438/488 |
| 2015/0140753 A1 | 5/2015 | Simsek-Ege et al. |
| 2015/0200204 A1 | 7/2015 | Fukuzumi et al. |
| 2015/0221667 A1 | 8/2015 | Fukuzumi et al. |
| 2016/0225783 A1* | 8/2016 | Ishibashi ............. H01L 27/1157 |
| 2016/0240554 A1 | 8/2016 | Fukuzumi et al. |
| 2016/0322381 A1* | 11/2016 | Liu ................... H01L 27/11573 |
| 2016/0336340 A1* | 11/2016 | Song ................. H01L 27/11582 |
| 2017/0069646 A1* | 3/2017 | Arisumi ............ H01L 27/11568 |
| 2017/0069650 A1* | 3/2017 | Iinuma .............. H01L 27/11582 |
| 2017/0069651 A1* | 3/2017 | Sakamoto ......... H01L 27/11582 |
| 2017/0194254 A1* | 7/2017 | Sakamoto ........... H01L 23/5283 |

FOREIGN PATENT DOCUMENTS

| | | |
|---|---|---|
| JP | 2009-200443 | 9/2009 |
| JP | 2009-212280 | 9/2009 |
| JP | 2012-142556 | 7/2012 |
| JP | 2012-146861 | 8/2012 |

* cited by examiner

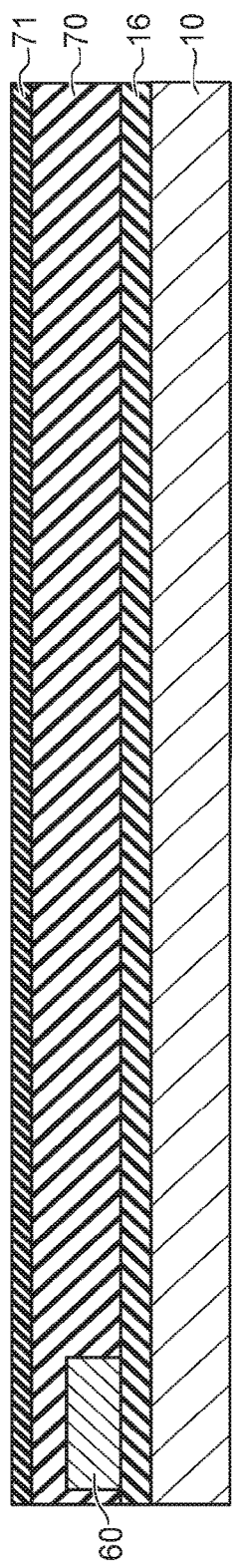
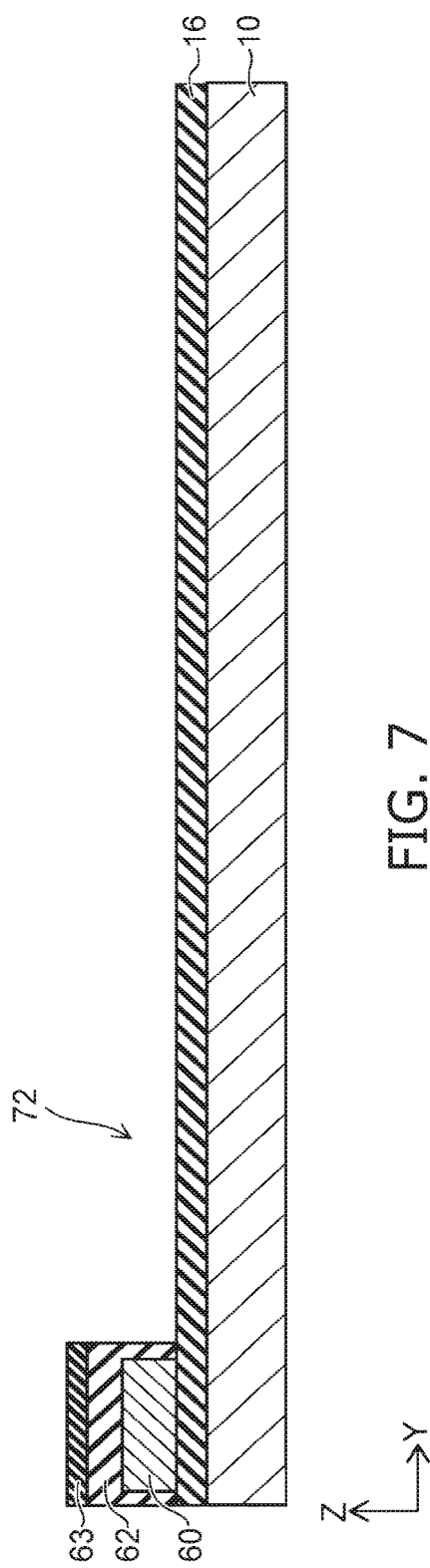

SEMICONDUCTOR MEMORY DEVICE AND METHOD FOR MANUFACTURING SAME

CROSS-REFERENCE TO RELATED APPLICATION

This application is based upon and claims the benefit of priority from U.S. Provisional Patent Application 62/308,550, filed on Mar. 15, 2016; the entire contents of which are incorporated herein by reference.

FIELD

Embodiments described herein relate generally to a semiconductor memory device and a method for manufacturing the same.

BACKGROUND

A 3-dimensional structure semiconductor memory device including a memory hole and a silicon body on a substrate has been proposed. The memory hole is formed in a stacked body stacked with a plurality of electrode layers via insulating layers, and the silicon body serving as a channel is provided on a side wall of the memory hole via a charge storage layer. In such a memory device, due to the increase in the number of the electrode layers stacked, the memory hole is formed so as to be long in a stacking direction. When the memory hole is formed by etching, a part of the substrate is also removed, whereby the substrate is likely to be largely engraved. As the increase of a part engraved in the substrate, it is concerned that the silicon body is hard to be formed in the memory hole.

BRIEF DESCRIPTION OF THE DRAWINGS

FIG. 6 to FIG. 16 are views showing a method for manufacturing the semiconductor memory device according to the embodiment.

DETAILED DESCRIPTION

Figure 1:
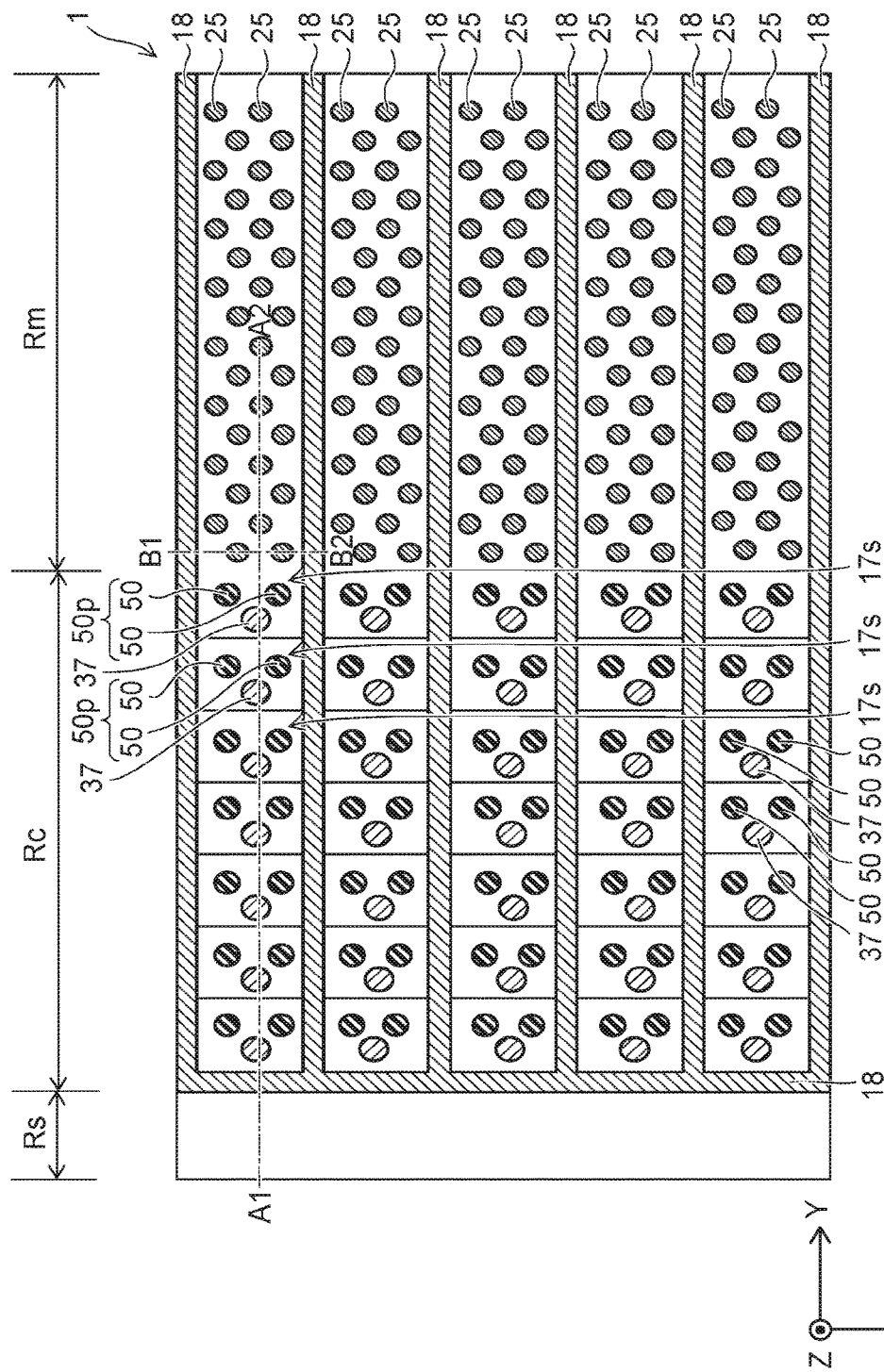
FIG. 1 is a plan view showing a semiconductor memory device according to an embodiment.

According to one embodiment, a semiconductor memory device includes a substrate, a stacked body, and a columnar portion. The stacked body includes a first insulating layer provided on the substrate, a first electrode layer provided on the first insulating layer and including polycrystalline silicon, a second insulating layer provided on the first electrode layer, and a second electrode layer provided on the second insulating layer. The columnar portion includes a semiconductor layer extending in a stacking direction of the stacked body and a memory layer provided between the semiconductor layer and the stacked body. The first and second electrode layers respectively have a first thickness and a second thickness in the stacking direction, and the first thickness of the first electrode layer is thicker than the second thickness of the second electrode layer.

Various embodiments will be described hereinafter with reference to the accompanying drawings. In the drawings, similar concept is marked with the same reference numerals. The drawings shown below are schematic. For example, for convenience of viewing the drawings, in some drawings, some constituent elements are omitted or the number of the constituent elements is decreased for drawing. The number of the constituent elements and size ratio are not always matched among drawings.

EMBODIMENT

Figure 2:
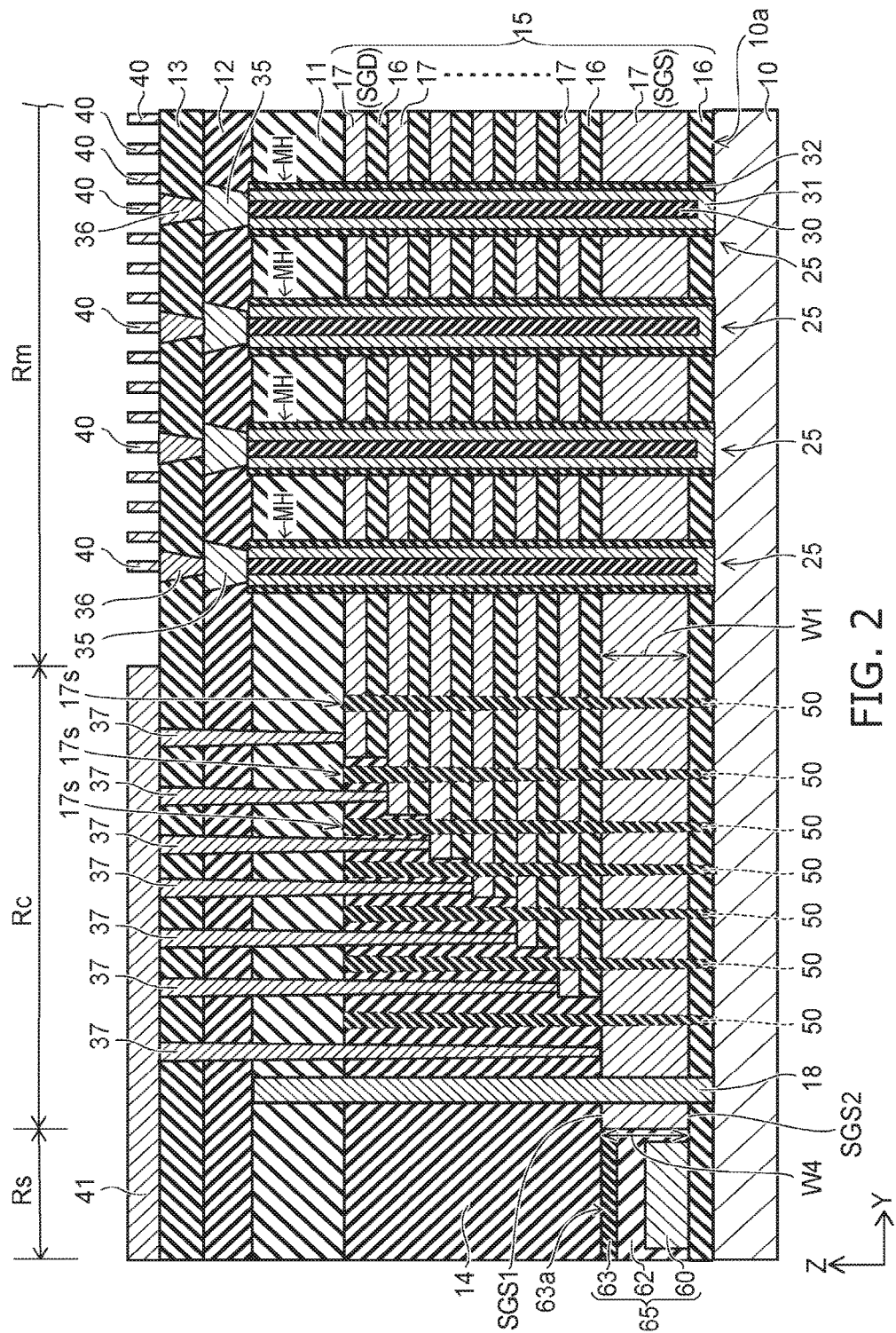
FIG. 2 is a cross-sectional view showing the semiconductor memory device according to the embodiment.
Figure 3:
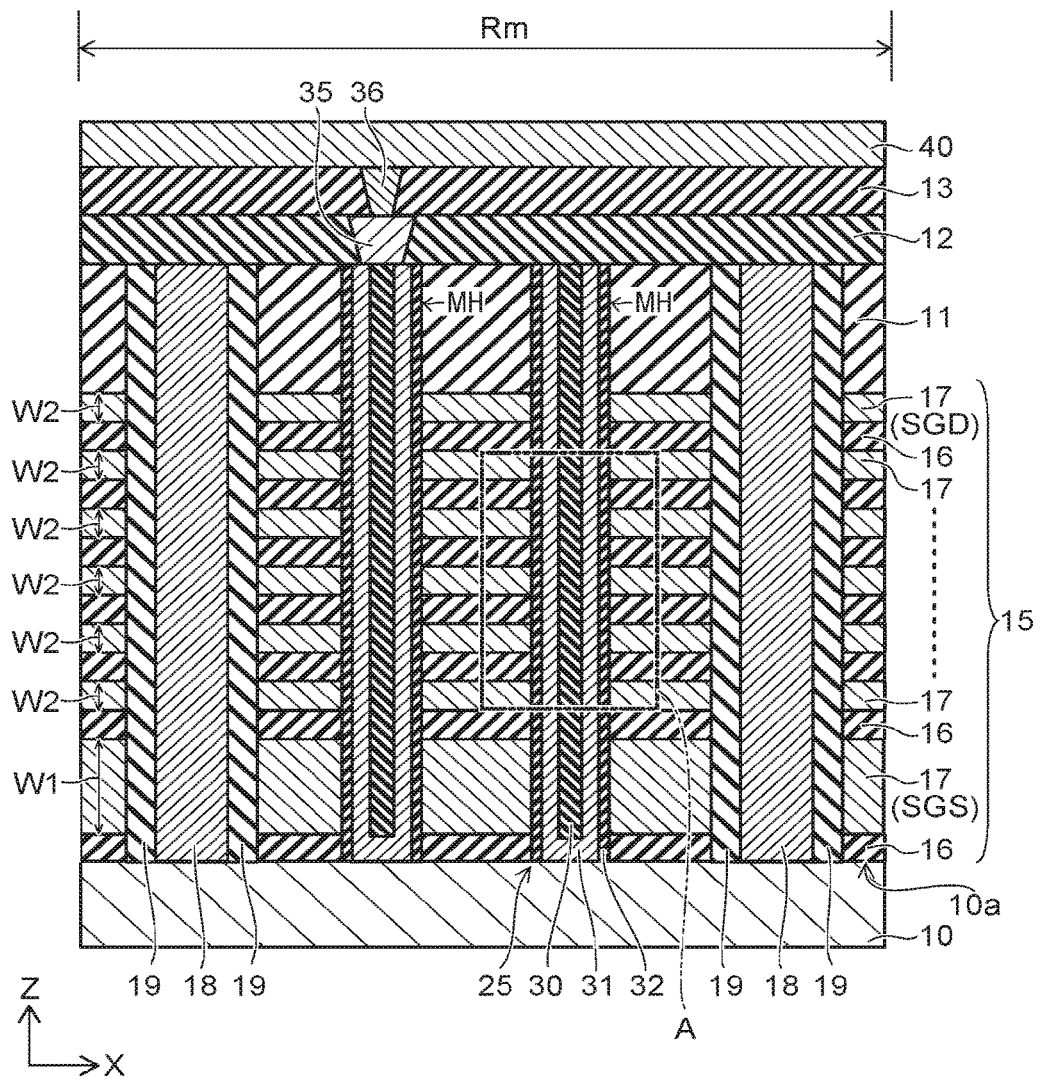
FIG. 3 is a cross-sectional view showing a part of the semiconductor memory device according to the embodiment.

FIG. 1 shows a plan view of a semiconductor memory device 1. FIG. 2 shows a Y-Z cross-sectional view along line A1-A2 in FIG. 1. FIG. 3 shows a X-Z cross-sectional view along line B1-B2 in FIG. 1.

Hereinafter, in the specification, for convenience of description, an XYZ orthogonal coordinate system will be used for description. Two directions parallel to an upper surface 10a of a substrate 10 and orthogonal each other are taken as "X-direction" and "Y-direction", and a direction orthogonal to both the X-direction and the Y-direction is taken as "Z-direction".

As shown in FIG. 1, in the semiconductor memory device 1, a memory cell region Rm, a contact region Rc, and a peripheral region Rs are provided. The memory cell region Rm, the contact region Rc, and the peripheral region Rs are arranged along the Y-direction.

Hereinafter, first, the memory cell region Rm of the semiconductor memory device 1 will be described.

As shown in FIG. 2 and FIG. 3, in the memory cell region Rm, a stacked body 15 is provided on the substrate 10. The substrate 10 is, for example, a silicon substrate. The stacked body 15 includes a plurality of electrode layers 17 and a plurality of insulating layers 16. The plurality of electrode layers 17 are respectively separately stacked, and the plurality of insulating layers 16 are provided between the plurality of electrode layers 17. The plurality of electrode layers 17 and the plurality of insulating layers 16 are, for example, stacked alternately one layer by one layer. The number of the electrode layers 17 is arbitrary.

Each of the electrode layers 17 except for a source side selection gate SGS includes, for example, a metal such as tungsten (W) or molybdenum (Mo) or the like. Each of the electrode layers 17 may be formed of a main body portion made of, for example, tungsten or molybdenum, and a barrier metal layer made of, for example, titanium nitride and covering a surface of the main body portion. The insulating layer 16 includes, for example, silicon oxide $(SiO_2)$.

In the electrode layers 17 of the stacked body 15, the lowermost electrode layer 17 corresponds to the source side selection gate SGS. The insulating layer 16 is provided between the source side selection gate SGS and the substrate 10. The source side selection gate SGS will be described in detail later.

In the electrode layers 17 of the stacked body 15, the uppermost electrode layer 17 corresponds to a drain side selection gate SGD. The drain side selection gate SGD may be formed of a single layer or a plurality of layers being stacked.

In the electrode layers 17 of the stacked body 15, the electrode layer 17 positioned between the uppermost electrode layer 17 and the lowermost electrode layer 17 corresponds to a word line.

An insulating layer 11 is provided on the stacked body 15. The insulating layer 11 includes, for example, silicon oxide.

A plurality of columnar portions 25 extending in the Z-direction are provided in the stacked body 15 and the insulating layer 11. The columnar portion 25 is, for example, provided cylindrically or elliptic cylindrically. For example, as shown in FIG. 1, the plurality of columnar portions 25 are disposed in staggered lattice-like. The plurality of columnar portions 25 may be disposed in square lattice-like along the X-direction and the Y-direction. The columnar portion 25 extends in the Z-direction to be buried in each of the insulating layers 16 and each of the electrode layers 17.

As shown in FIG. 2 and FIG. 3, the columnar portion 25 is provided in a memory hole MH. The memory hole MH extends through the stacked body 15 and the insulating layer 11 in the Z-direction.

The columnar portion 25 includes a core insulating layer 30, a semiconductor layer 31 corresponding to a channel body, and a memory layer 32. The core insulating layer 30, the semiconductor layer 31, and the memory layer 32 extend continuously in the Z-direction. A memory cell including the memory layer 32 is formed at each intersection between the semiconductor layer 31 and the electrode layers 17.

The semiconductor layer 31 is provided between the core insulating layer 30 and the memory layer 32, and surrounds the core insulating layer 30 from an outer side thereof. The semiconductor layer 31 has, for example, a tubular shape. A lower end of the semiconductor layer 31 contacts the substrate 10. The semiconductor layer 31 includes, for example, silicon (Si). The silicon is, for example, polysilicon made of amorphous silicon that is crystallized. The core insulating layer 30 may not be disposed inside the semiconductor layer 31.

Figure 4:
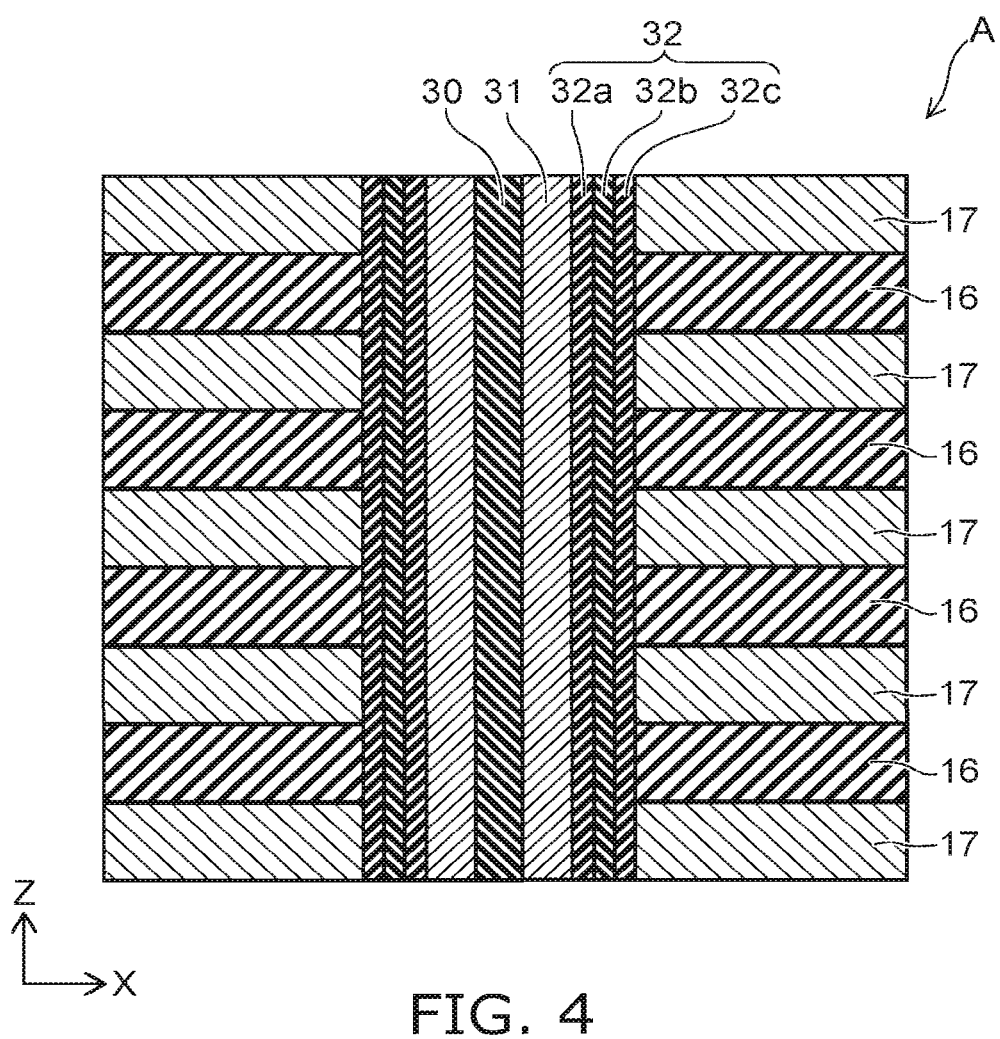
FIG. 4 is an enlarged view showing a part of FIG. 3.

The memory layer 32 is provided between the semiconductor layer 31 and the stacked body 15, and surrounds the semiconductor layer 31 from an outer side thereof. The memory layer 32 is provided on an inner wall of the memory hole MH. FIG. 4 shows an enlarged view of a region A in FIG. 3. As shown in FIG. 4, the memory layer 32 includes a charge storage layer 32b. For example, the memory layer 32 is a stacked layer including a tunnel insulating layer 32a, the charge storage layer 32b and a block insulating layer 32c. In this case, the block insulating layer 32c, the charge storage layer 32b and the tunnel insulating layer 32a are provided between the stacked body 15 and the semiconductor layer 31 in order from a side of the stacked body 15.

The tunnel insulating layer 32a is, for example, a silicon oxide single layer or an ONO layer which is stacked with a silicon oxide layer(O), a silicon nitride layer(N) and a silicon oxide layer(O). The tunnel insulating layer 32a is a potential barrier between the charge storage layer 32b and the semiconductor layer 31. In the tunnel insulating layer 32a, when injecting a charge from the semiconductor layer 31 to the charge storage layer 32b (writing operation) and diffusing a charge from the charge storage layer 32b to the semiconductor layer 31 (erasing operation), the charge tunnels.

The charge storage layer 32b is a layer for storing the charge. For example, the charge storage layer 32b is formed of a material having a trap site of an electron, for example, silicon nitride ($Si_3N_4$). The charge storage layer 32b may be formed of hafnium oxide ($HfO_2$). A threshold value of the memory cell changes depending on presence or absence of the charge trapped at the trap site and the trapped charge amount. Thereby, the memory cell holds information.

The block insulating layer 32c is, for example, a silicon oxide layer of a single layer or a stacked layer stacked with a silicon oxide layer, and an aluminum oxide layer made of aluminum oxide ($Al_2O_3$). The block insulating layer 32c protects, for example, the charge storage layer 32b from being etched when the electrode layers 17 are formed. The memory layer 32 capable of storing the charge is constituted from the tunnel insulating layer 32a, the charge storage layer 32b and the block insulating layer 32c. Therefore, the memory layer 32 is disposed between the semiconductor layer 31 and the electrode layers 17.

As shown in FIG. 3, a plurality of interconnection portions are provided on the substrate 10. The plurality of interconnection portions 18 are arranged so as to be separated from each other along the X-direction, and extend in the Y-direction. A lower end of the interconnection portion 18 contacts the upper surface 10a of the substrate 10. For example, the interconnection portion 18 is provided such that a width of an upper end in the X-direction and a width of the lower end in the X-direction are the same as each other. The interconnection portion 18 may be provided such that the width of the interconnection portion 18 in the X-direction is smallest at the lower end, increases moving upwards, and is greatest at the upper end.

Between each two adjacent interconnection portions 18 in the X-direction, the stacked body 15 and the insulating layer 11 are provided in that order from bottom to top. The stacked body 15 and the insulating layer 11 are divided by the interconnection portions 18 and extend in the Y-direction. Therefore, the insulating layers 16 and the electrode layers 17 also extend in the Y-direction. The interconnection portion 18 includes, for example, a metal such as tungsten or molybdenum or the like.

An insulating side wall 19 is provided between the interconnection portion 18 and a structure composed of the stacked body 15 and the insulating layer 11. The electrode layer 17 is insulated from the interconnection portion 18 by the side wall 19. The side wall 19 also extends in the Y-direction. The side wall 19 includes, for example, silicon oxide.

A plurality of bit lines 40 are provided on the stacked body 15 via the insulating layer 11, an insulating layer 12 and an insulating layer 13. The plurality of bit lines 40 are, for example, formed of metal layers. The plurality of bit lines 40 are separated from each other along the Y-direction, and extend in the X-direction. The insulating layer 12 is provided on the insulating layer 11, and the insulating layer 13 is provided on the insulating layer 12. The insulating layer 12 and the insulating layer 13 include, for example, silicon oxide.

A contact portion 35 and a contact portion 36 are provided on the columnar portion 25. The contact portion 35 is provided on an upper end of the semiconductor layer 31 and positioned within the insulating layer 12. The contact portion 36 is provided on the contact portion 35 and positioned within the insulating layer 13. The contact portion 36 is thinner than the contact portion 35. The contact portion 35 and the contact portion 36 are, for example, contact plugs, and are formed of stacked metal containing layers such as tungsten and titanium nitride layers or the like.

Next, the contact region Rc of the semiconductor memory device 1 will be described.

As shown in FIG. 1 and FIG. 2, in the contact region Rc, an end portion of the stacked body 15 is a stepped shape, and a step 17s is formed for each of the electrode layers 17. An insulating layer 14 also covers the stepped-shaped end portion of the stacked body 15, and an upper surface of the insulating layer 14 is flat. The insulating layer 14 includes, for example, silicon oxide.

Columnar members 50 are provided above each step 17s of each stacked body 15 and penetrate the insulating layer 14 and the stacked body 15 in the Z-direction. Two columnar members 50 are separated from each other along the X-direction, and a plurality of groups 50p of the two columnar members 50 are provided along the Y-direction and separated from each other. Here, each group 50p includes two columnar members 50, however each group 50p may include any number of columnar members 50. For example, the columnar member 50 is a cylinder-shaped or polygonal column-shaped and is formed of silicon oxide. For example, a lower end of the columnar member 50 contacts the upper surface 10a of the substrate 10.

A contact portion 37 is provided on each step 17s of each stacked body 15. Each of the contact portions 37 extends in the Z-direction and pierces the insulating layers 11, 12, 13 and 14. The contact portion 37 is provided in the vicinity of the columnar member 50. In the example shown in FIG. 1 and FIG. 2, as indicated by the line A1-A2 of FIG. 1, when a line passing through the respective contact portions 37 is drawn in the Y-direction, the columnar members 50 are not located on this line, but located on both sides of each contact portion 37. That is, when viewing the cross-sectional view (FIG. 2) cut along the line A1-A2, the columnar members 50 are provided on a front side and a depth side of the respective contact portions 37 as shown by a dotted line. A lower end of the contact portion 37 is connected to the electrode layer 17. In the embodiment, one contact portion 37 is connected to each electrode layer 17, however a plurality of contact portions 37 may be connected to each electrode layer 17.

A plurality of upper-layer word lines 41 extending in the Y-direction are provided on the insulating layer 13. An upper end of the contact portion 37 is connected to the upper-layer word line 41. For this reason, each of the electrode layers 17 is connected to one upper-layer word line 41 via the contact portion 37. In FIG. 2, for convenience of showing drawings, the plurality of contact portions 37 are drawn in the same Y-Z cross-section, however practically, the plurality of contact portions 37 connected to different electrode layers 17 are disposed at mutually different positions in the X-direction. For this reason, one upper-layer word line 41 shown in FIG. 2 is connected to only one electrode layer 17 via the contact portion 37.

In the contact region Rc, the interconnection portion 18 extends in the X-direction. The interconnection portion 18 extending in the X-direction is connected to the respective end portions of the plurality of interconnection portions 18 extending in the Y-direction in the memory cell region Rm as described above. The side wall 19 is provided between the insulating layer 14 and the interconnection portion 18 extending in the X-direction, but is not shown in FIG. 2. Therefore, the side wall 19 also extends in the X-direction. In the contact region Rc, the interconnection portion 18 and the side wall 19 extend through the insulating layer 11, the insulating layer 14, and a part (the insulating layer 16 and the source side selection gate SGS) of the stacked body 15 in the Z-direction.

Next, the peripheral region Rs of the semiconductor memory device 1 will be described.

As shown in FIG. 2, a plurality of transistors 60 are provided in the peripheral region Rs. Each transistor 60 includes a gate electrode, a source electrode, and a drain electrode. The plurality of transistors 60 are disposed on the lowermost insulating layer 16 which is provided directly on the substrate 10, according to a well-known method. The plurality of transistors 60 constitute, for example, a part of a word line driving circuit as a peripheral circuit, and a part of the transistor 60 is connected to the electrode layer 17.

An address buffer and a row decoder may be provided in the peripheral region Rs. The address buffer is a circuit for temporarily storing a physical address of the memory cell output from a control circuit or the like, and outputting the physical address to the row decoder. The row decoder is a circuit for selecting the electrode layer 17 corresponding to the memory cell based on the physical address input from the address buffer, and outputting the result to the word line driving circuit. For example, the word line driving circuit generates a potential to be supplied to each of the electrode layers 17, based on a signal input from the row decoder.

The peripheral circuit connected to the bit line 40, for example, a column decoder and a bit line amplification circuit may be provided in the peripheral region Rs. The column decoder is a circuit for selecting the bit line 40 corresponding to the memory cell based on the physical address input from the address buffer. The bit line amplification circuit is a circuit for generating a potential to be supplied to each of the bit lines 40, based on a signal input from the column decoder when writing data, and amplifying the potential of the bit line 40 when reading data.

An insulating layer 62 is provided on the lowermost insulating layer 16 which is provided directly on the substrate 10 so as to cover the transistor 60. The transistor 60 is insulated from the electrode layer 17 (the source side selection gate SGS) by the insulating layer 62. The insulating layer 62 includes, for example, silicon oxide.

An insulating layer 63 is provided on the insulating layer 62. The insulating layer 63 includes, for example, silicon nitride. The insulating layer 14 is provided on the insulating layer 63 (an upper surface 63a). A structure 65 is constituted from the transistor 60, the insulating layer 62 and the insulating layer 63.

Hereinafter, a connection between constituent elements in the semiconductor memory device 1 will be described.

In the memory cell region Rm, the upper end of the semiconductor layer 31 is connected to the bit line 40 via the contact portion 35 and the contact portion 36. The plurality of semiconductor layers 31 selected one by one from regions apart in the X-direction are connected to one common bit line 40. The lower end of the semiconductor layer 31 is electrically connected to a source line (not shown) via the substrate 10 and the interconnection portion 18.

In the memory cell region Rm, a large number of memory cells are arranged in a 3-dimensional matrix along the X-direction, the Y-direction and the Z-direction, and data can be stored in each of the memory cells. On the other hand, in the contact region Rc and the peripheral region Rs, each of the electrode layers 17 is led out of the memory cell region Rm and connected to the word line driving circuit via the contact portion 37 and the upper-layer word line 41.

Hereinafter, the source side selection gate SGS will be described.

Figure 5:
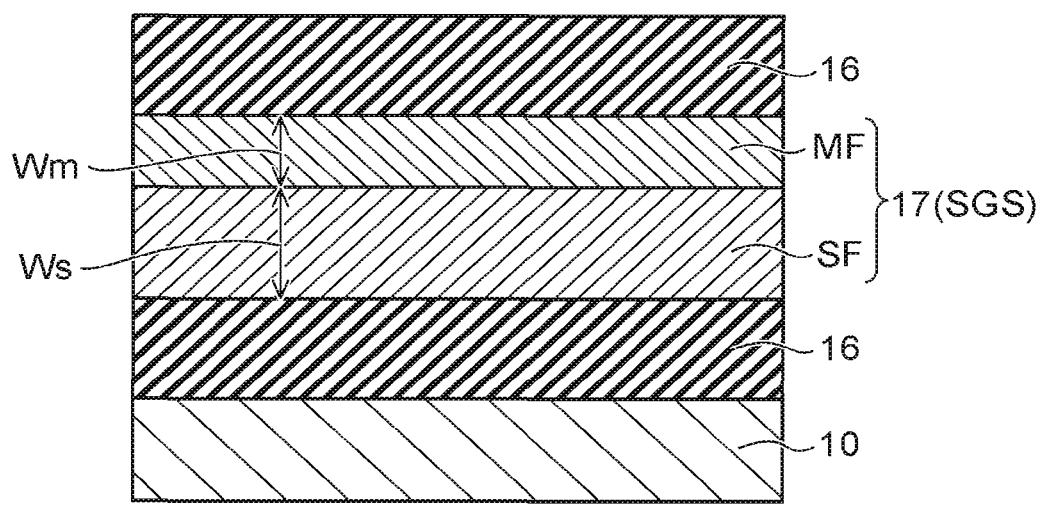
FIG. 5 is an enlarged view showing a part of a semiconductor memory device according to another embodiment.

FIG. 5 shows an enlarged view showing a variation of the source side selection gate SGS.

The source side selection gate SGS is provided on the insulating layer 16 in the memory cell region Rm and the contact region Rc. The number of stacked layers in the source side selection gate SGS is arbitrary, and the source side selection gate SGS may be formed of a single layer or a plurality of layers being stacked.

In the case where the source side selection gate SGS is formed of the single layer, the source side selection gate SGS is formed of a layer including silicon, for example, polycrystalline silicon (polysilicon). The source side selection gate SGS includes, for example, boron (B) or phosphorus (P), as an impurity for applying conductivity to a polycrystalline silicon layer.

In the case where the source side selection gate SGS is stacked, for example, the source side selection gate SGS is constituted from a stacked body in which a layer including a metal made of tungsten or molybdenum, or a layer including these metal compounds is provided on the polycrystalline silicon layer. For example, the source side selection gate SGS is constituted from a stacked body in which a layer including tungsten and silicon is provided on the polycrystalline silicon layer.

As shown in FIG. 5, the source side selection gate SGS includes a polycrystalline silicon layer SF and a metal layer MF, and is provided between the insulating layers 16. For example, a thickness Ws of the polycrystalline silicon layer SF in the Z-direction is greater than a thickness Wm of the metal layer MF in the Z-direction. In the example of FIG. 5, the metal layer MF is provided on the polycrystalline silicon layer SF, however the polycrystalline silicon layer SF may be provided on the metal layer MF. The source side selection gate SGS may be formed such that the metal layer MF is sandwiched by the polycrystalline silicon layers SF.

As shown in FIG. 3, a thickness W1 of the source side selection gate SGS in the Z-direction is greater than a thickness W2 of each electrode layer 17 in the Z-direction. For example, the thickness W1 is three times or more the thickness W2. In the example of FIG. 3, each electrode layer 17 of the stacked body 15 has the thickness W2, however thicknesses of the electrode layers 17 may be different each other. In the case where the thicknesses of the electrode layers 17 are different each other, the thickness W1 is greater than a thickness of each electrode layer 17, for example, the thickness W1 is three times or more the thickness of each electrode layer 17.

The thickness W1 can be adjusted according to an aspect ratio of the memory hole MH at processing the memory hole MH by RIE (Reactive Ion Etching) or the like. For example, the thickness W1 is 150 nanometers or more.

For example, in the case where a thickness of the polycrystalline silicon layer is the same as a thickness of a metal layer made of tungsten or the like, a sheet resistance value of the polycrystalline silicon layer is higher than a sheet resistance value of the metal layer. On the other hand, when the source side selection gate SGS is formed such that the thickness W1 of the source side selection gate SGS is greater than the thickness W2 of the electrode layer 17, it is possible to reduce a difference between a sheet resistance value of the source side selection gate SGS and a sheet resistance value of the electrode layer 17. Thereby, there is little difference in resistance value between the source side selection gate SGS and the electrode layer 17. Therefore, it is possible to suppress problems due to differences in memory operating characteristics of each memory cell depending on the source side selection gate SGS and the electrode layer 17.

In the case where the source side selection gate SGS is formed of the stacked body with the polycrystalline silicon layer and the metal layer, as compared with the case where the source side selection gate SGS is formed of the single layer with the polycrystalline silicon layer, it is possible to more reduce the difference between the sheet resistance value of the source side selection gate SGS and the sheet resistance value of the electrode layer 17.

As shown in FIG. 2, the source side selection gate SGS has an upper surface SGS1 and a lower surface SGS2. The upper surface SGS1 is a surface opposite to the lower surface SGS2. In the memory cell region Rm, the insulating layer 16 is provided on the upper surface SGS1. The insulating layer 16 is also provided on the lower surface SGS2. In the contact region Rc, the insulating layer 14 and the insulating layer 16 are provided on the upper surface SGS1. The insulating layer 16 is provided on the lower surface SGS2.

For example, the upper surface SGS1 of the source side selection gate SGS, and the upper surface 63a of the insulating layer 63 provided in the peripheral region Rs may be provided on the same plane in the X-Y plane. By a position of the upper surface SGS1 in the Z-direction becoming the same as a position of the upper surface 63a in the Z-direction, the thickness W1 of the source side selection gate SGS can be the same as a thickness W4 of the structure 65 constituted from the transistor 60, the insulating layer 62 and the insulating layer 63. Thereby, the source side selection gate SGS and the structure 65 are likely to be flattened. Therefore, since it is difficult to occur a step between the source side selection gate SGS and the structure 65, in the case of forming the stacked body 15 after forming the structure 65 including the transistor 60 on the substrate 10, it is possible to simplify the manufacturing process.

The structure 65 may be constituted from the transistor 60 and the insulating layer 62. In this case, the upper surface SGS1 of the source side selection gate SGS and an upper surface of the insulating layer 62 may be provided on the same plane in the X-Y plane.

Hereinafter, a method for manufacturing the semiconductor memory device according to the embodiment will be described.

FIG. 6 to FIG. 16 are views showing a method for manufacturing the semiconductor memory device according to the embodiment.

FIG. 6 to FIG. 16 are cross-sectional views showing the method for manufacturing the semiconductor memory device, and correspond to the cross-sectional view of FIG. 2. FIG. 6 to FIG. 16 show a portion lower than the insulating layer 12.

Firstly, as shown in FIG. 6, the insulating layer 16 is formed on the substrate 10, and then the transistor 60 is formed on the insulating layer 16. The insulating layer 16 is formed of, for example, silicon oxide. In the peripheral region Rs, the peripheral circuit is formed by disposing a plurality of transistors 60. Subsequently, an insulating layer 70 is formed on the insulating layer 16, and then an upper surface of the insulating layer 70 is flattened by, for example, a CMP (Chemical Mechanical Polishing) method. The insulating layer 70 is formed so as to cover the transistor 60. The insulating layer 70 is formed of, for example, silicon oxide. Subsequently, an insulating layer 71 is formed on the insulating layer 70. The insulating layer 71 is formed of, for example, silicon nitride. The insulating layer 16, the insulating layer 70 and the insulating layer 71 are formed by, for example, a CVD (Chemical Vapor Deposition) method.

Next, as shown in FIG. 7, a cavity 72 is formed by removing a part of the insulating layer 70 and a part of the insulating layer 71 using, for example, the RIE. The insulating layer 70 and the insulating layer 71 in the peripheral region Rs are left without being removed. Thereby, the insulating layer 62 and the insulating layer 63 are formed. The insulating layer 62 is formed so as to cover the transistor 60.

Figure 8:
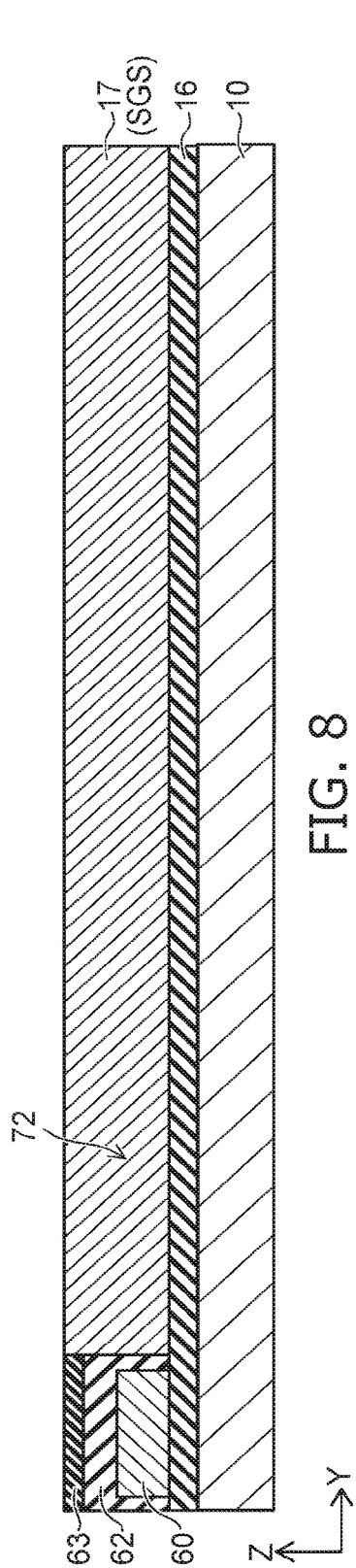

Next, as shown in FIG. 8, the polycrystalline silicon layer is formed in the cavity 72 by, for example, the CVD method. Subsequently, boron or the like is implanted in the polycrystalline silicon layer using ion implantation or plasma doping or the like. Thereby, conductivity is applied to the polycrystalline silicon layer, and the electrode layer 17 (the source side selection gate SGS) is formed in the cavity 72. The source side selection gate SGS is formed in the memory cell region Rm and the contact region Rc. For example, the source side selection gate SGS is formed such that the position of the upper surface thereof is the same as the position of the upper surface of the insulating layer 63. The source side selection gate SGS may be formed by forming, on the polycrystalline silicon layer, a metal layer made of tungsten or molybdenum.

Figure 9:
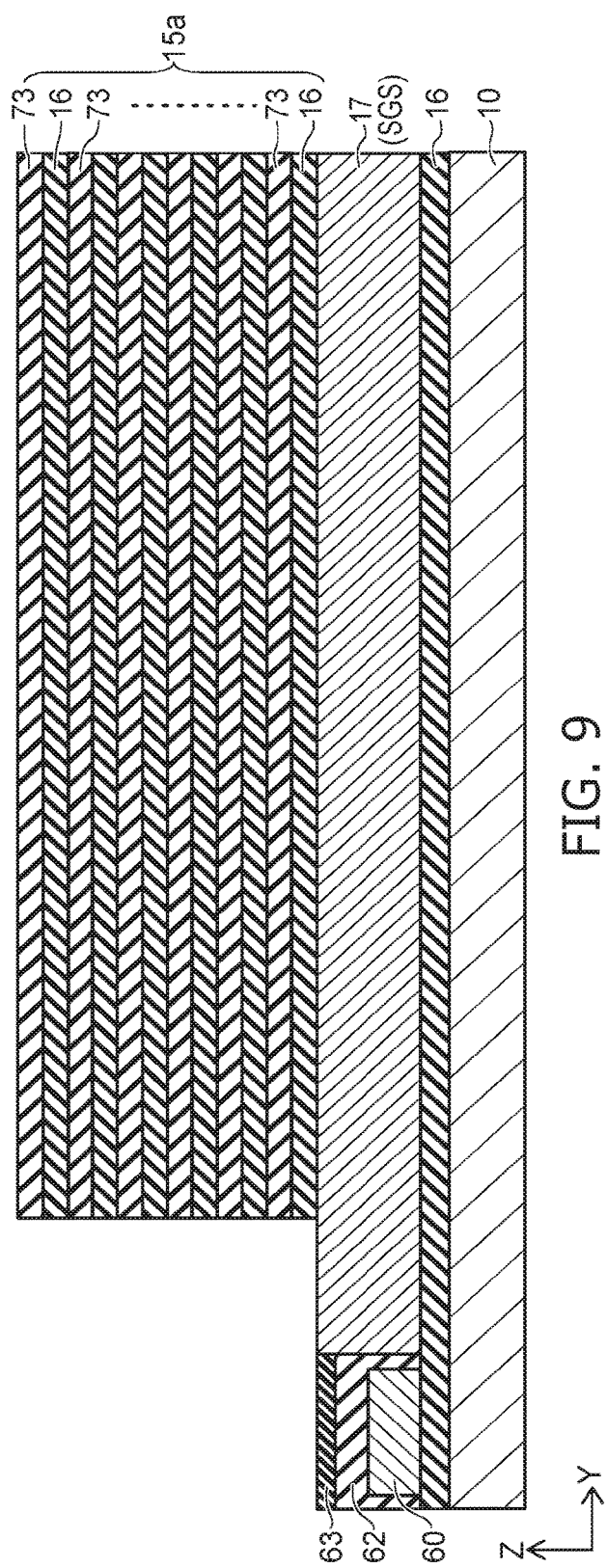

Next, as shown in FIG. 9, a stacked body 15a is formed on the source side selection gate SGS by alternately stacking the insulating layers 16 and sacrifice layers 73 along the Z-direction by, for example, the CVD method. The sacrifice layers 73 are formed of a material that an etching selection ratio is obtained to the insulating layers 16, for example, formed of silicon nitride.

Figure 10:
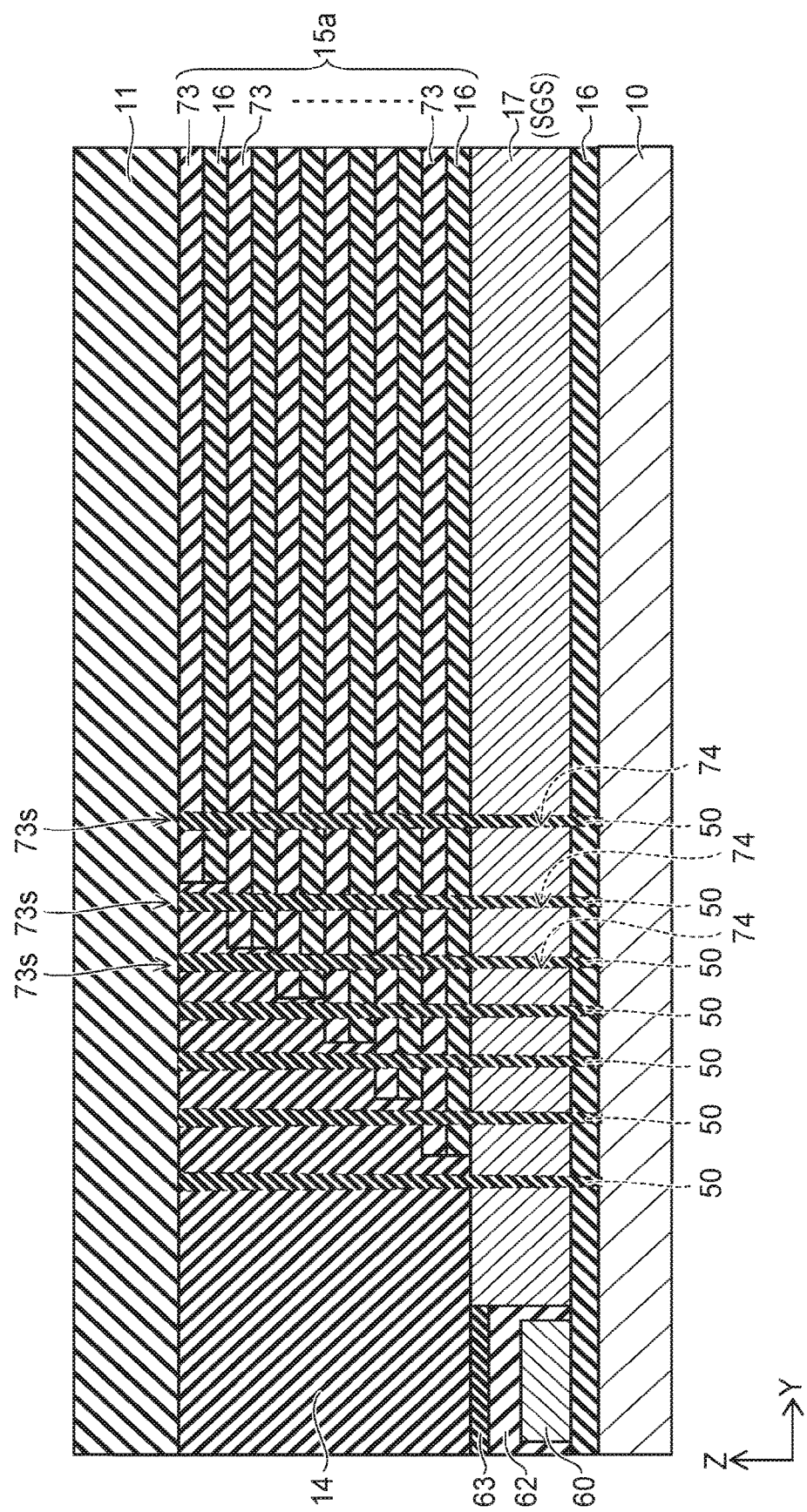

Next, as shown in FIG. 10, a step 73s is formed for each of the sacrifice layers 73 by processing an end portion of the stacked body 15a so as to be a stepped shape. The step 73s is formed in the contact region Rc. Subsequently, the insulating layer 14 is formed on the insulating layer 63 and the source side selection gate SGS by, for example, depositing silicon oxide. The insulating layer 14 is formed so as to cover the stacked body 15a. When forming the insulating layer 14, the insulating layer 14 is formed thick enough that the stepped shape of the stacked body 15a is not apparent in the upper surface of the insulating layer 14. Subsequently, holes 74 are formed by, for example, the RIE. The holes 74 pierce the insulating layer 14, the stacked body 15a, the source side selection gate SGS and the insulating layer 16. Subsequently, by, for example, the CVD method, silicon oxide is deposited on an inner surface of the hole 74 to form the columnar member 50. The columnar member 50 is formed in the contact region Rc, and the lower end thereof contacts the substrate 10. Thereafter, the insulating layer 11 is formed on the stacked body 15a and the insulating layer 14 by, for example, depositing silicon oxide.

Figure 11:
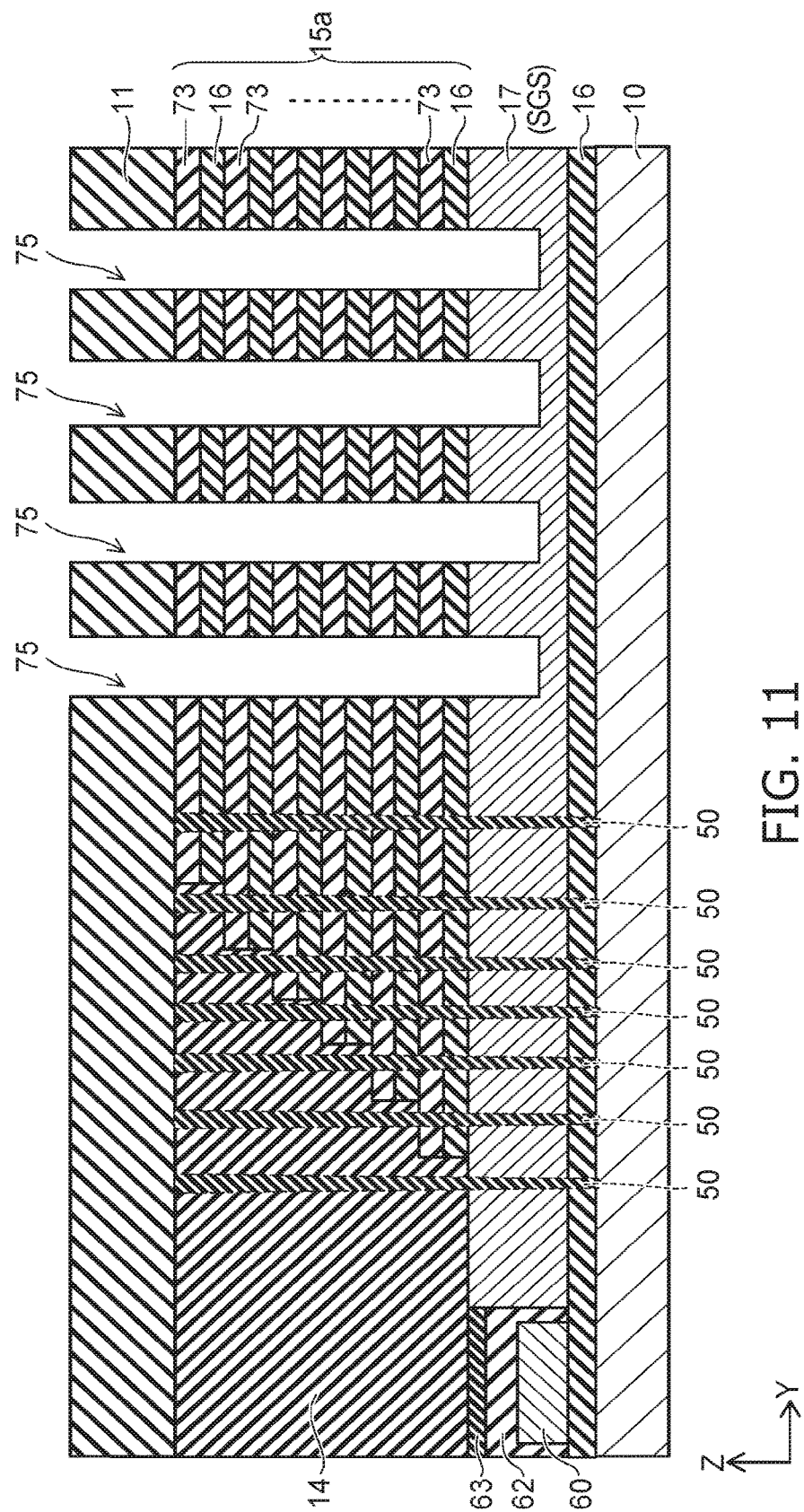

Next, as shown in FIG. 11, holes 75 are formed in the stacked body 15a by, for example, the RIE. The holes 75 extend in the Z-direction, pierce the insulating layer 11 and the stacked body 15a, and reach the source side selection gate SGS. A part of the source side selection gate SGS is removed without piercing the source side selection gate SGS by the holes 75. Since the polycrystalline silicon layer (the source side selection gate SGS) having a large thickness is formed between the stacked body 15a and the substrate 10, it is possible to stop the etching without piercing the source side selection gate SGS by an etching selection ratio between the stacked body 15a (silicon oxide and silicon nitride) and the source side selection gate SGS (the polycrystalline silicon layer). That is, the source side selection gate SGS functions as a layer for stopping the etching.

Figure 12:
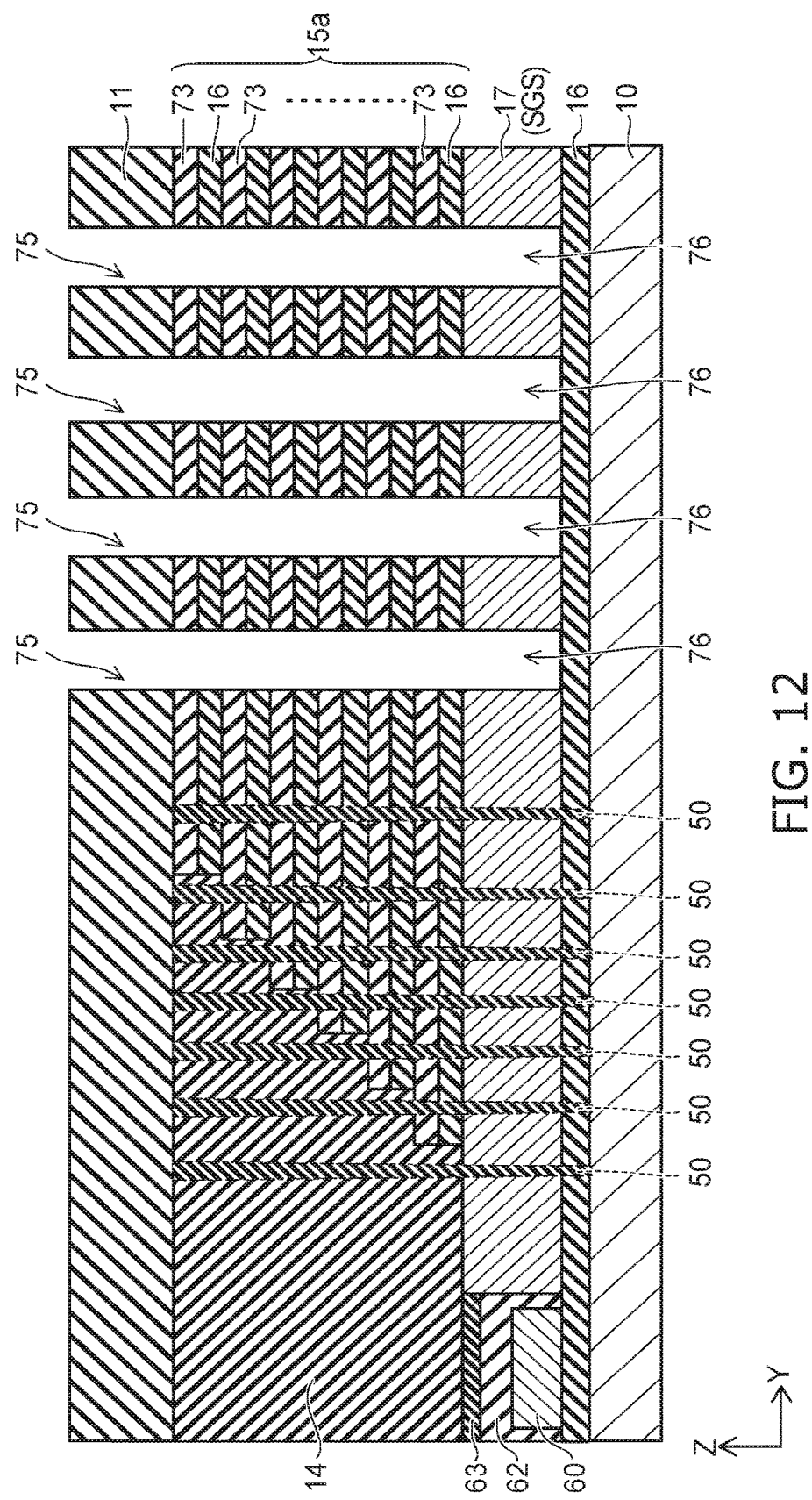

Next, as shown in FIG. 12, holes 76 are formed in the source side selection gate SGS by, for example, the RIE. The holes 76 extend in the Z-direction, pierce the source side selection gate SGS, and reach the insulating layer 16. In this case, an etching selection ratio between the insulating layer 16 (silicon oxide) and the source side selection gate SGS (the polycrystalline silicon layer) is set so as to stop the etching without piercing the insulating layer 16.

Figure 13:
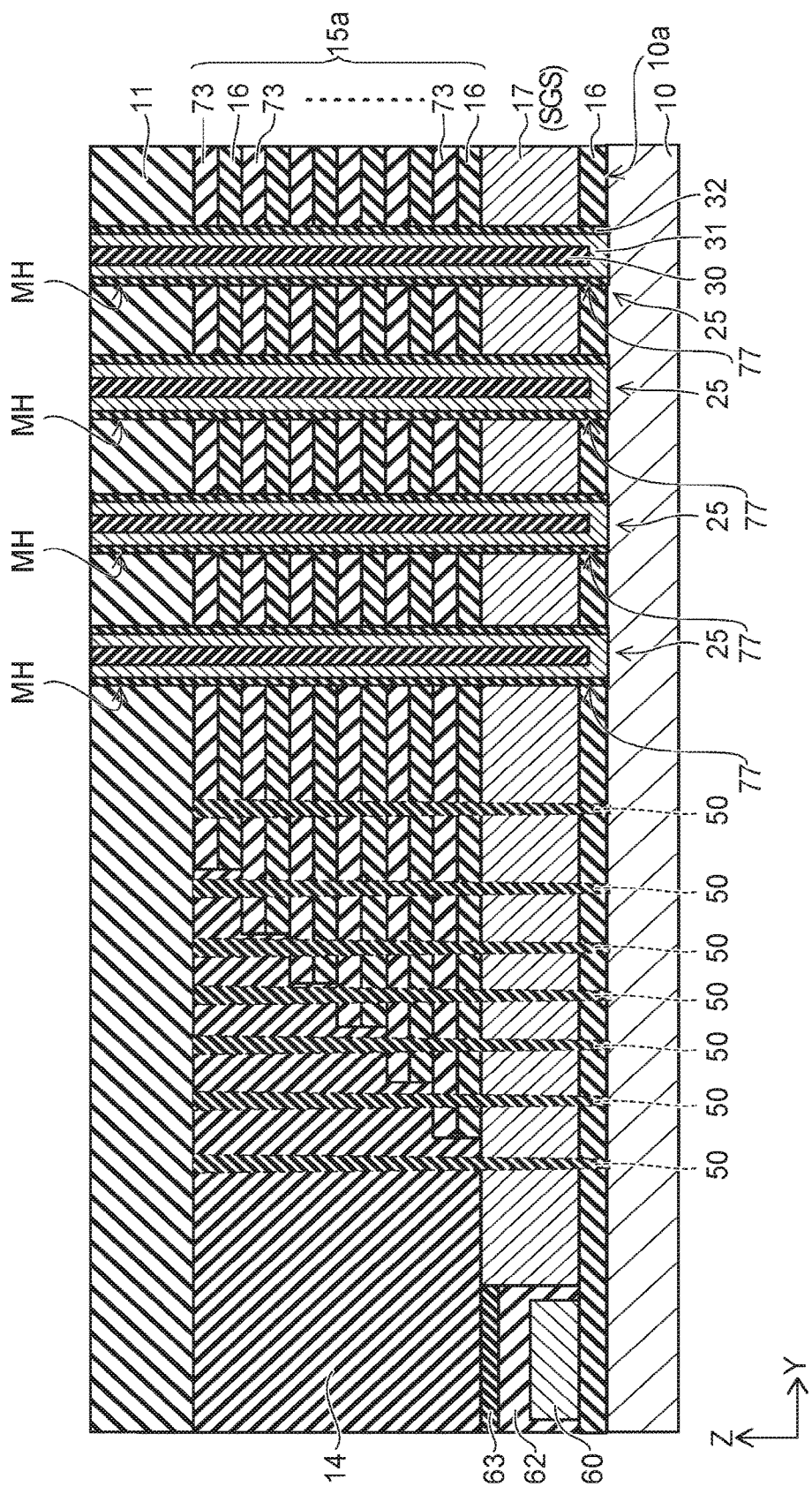

Next, as shown in FIG. 13, holes 77 piercing the insulating layer 16 are formed by, for example, the RIE. As a result, the memory holes MH are formed. The memory holes MH pierce the insulating layer 11, the stacked body 15a, the source side selection gate SGS and the insulating layer 16, and reach the substrate 10. The shape of the memory hole MH is circular viewed in the Z-direction. The memory holes MH are disposed, for example, to be staggered viewed in the Z-direction. Subsequently, the memory layer 32, the semiconductor layer 31 and the core insulating layer 30 are formed in the memory hole MH. Thereby, the columnar portion 25 is formed. By, for example, the CVD method, silicon oxide is deposited on an inner surface of the memory hole MH to form the block insulating layer 32c, silicon nitride is deposited to form the charge storage layer 32b, and silicon oxide is deposited to form the tunnel insulating layer 32a. Thereafter, the tunnel insulating layer 32a, the charge storage layer 32b and the block insulating layer 32c are removed from a bottom surface of the memory hole MH by performing the RIE, and the substrate 10 is exposed. Subsequently, after silicon is deposited to form the semiconductor layer 31, the core insulating layer 30 is formed. The lower end of the semiconductor layer 31 contacts the upper surface 10a of the substrate 10.

As shown in FIG. 11 to FIG. 13, when a plurality of holes (hole 75, hole 76 and hole 77) are formed stepwise so as to form the memory hole MH, it is possible to suppress the substrate 10 from being largely engraved. In the case of forming the hole 77, it may be a little over-etching from the upper surface 10a of the substrate 10.

Figure 14:
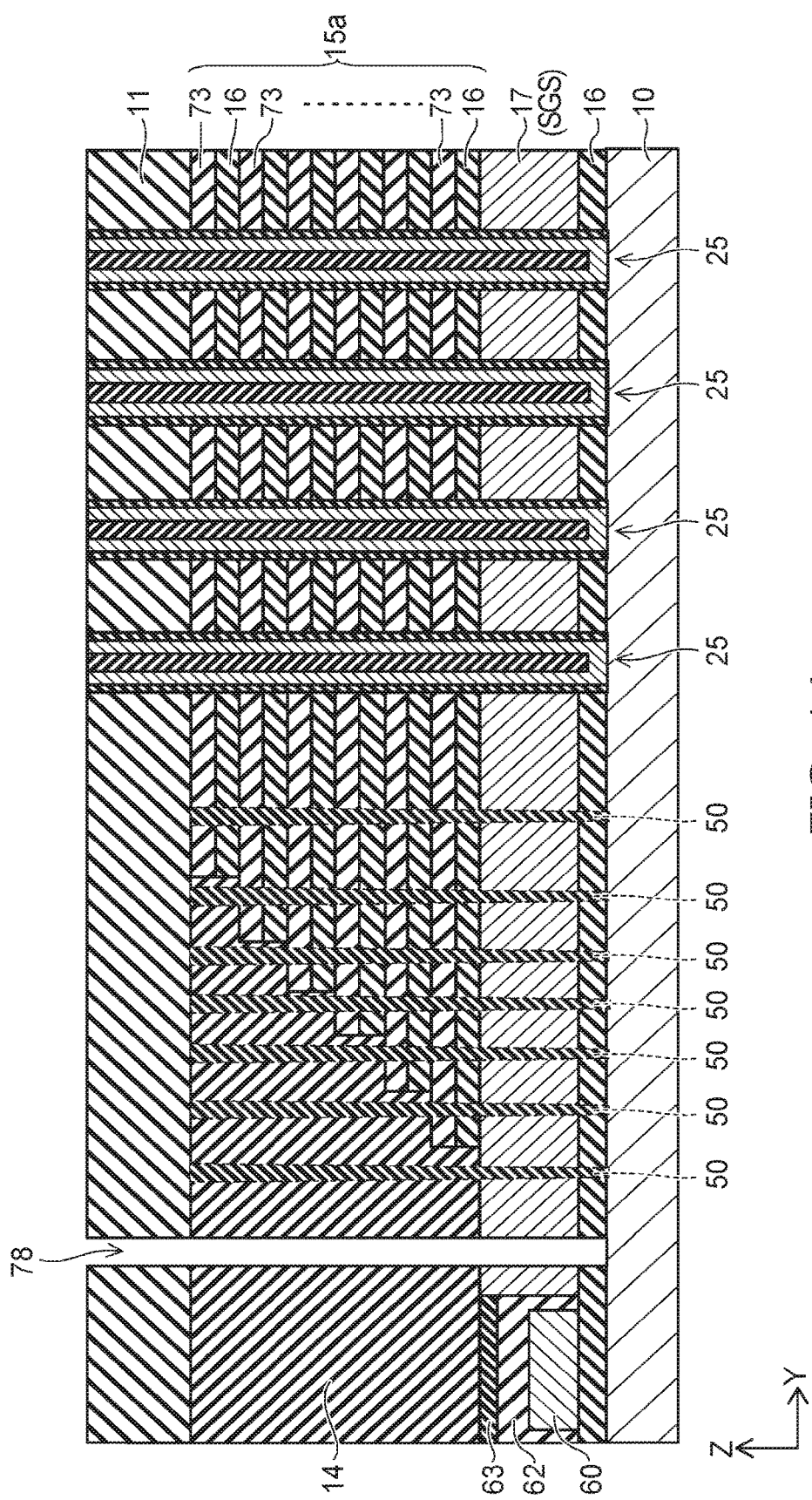

Next, as shown in FIG. 14, a plurality of slits 78 are formed by, for example, a photolithography method and anisotropic etching such as the RIE or the like. The slits 78 extend in the X-direction and the Y-direction. In FIG. 14, the slit 78 extending in the X-direction is shown. The slit 78 extending the X-direction is pierced through the insulating layer 11, the insulating layer 14, the source side selection gate SGS and the insulating layer 16. The slit 78 extending the Y-direction is pierced through the insulating layer 11, the stacked body 15a, the source side selection gate SGS and the insulating layer 16. Thereby, the stacked body 15a is divided into a plurality of stacked bodies extending in the Y-direction by the slits 78. The source side selection gate SGS and the insulating layer 16 are also divided by the slits 78.

Figure 15:
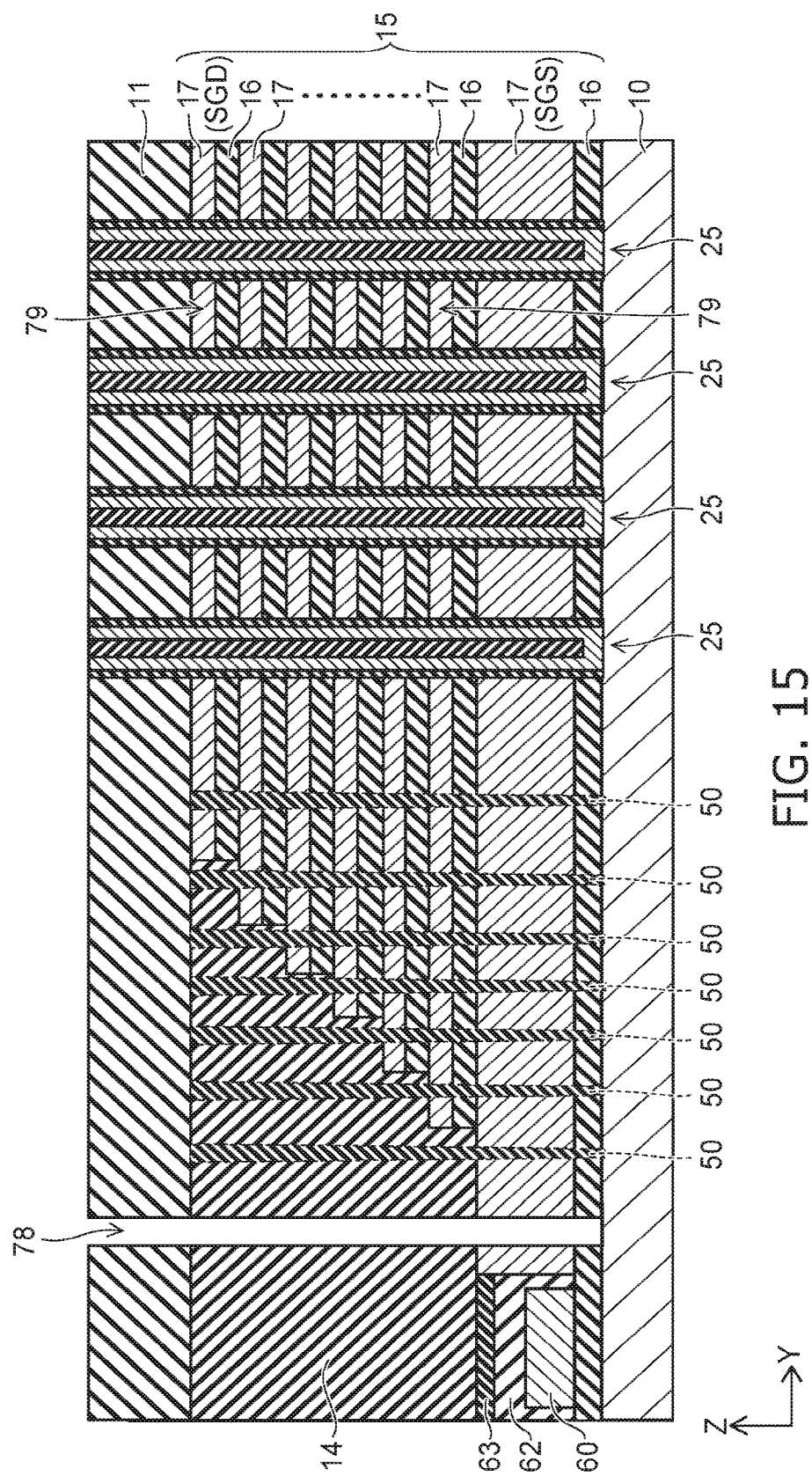

Next, as shown in FIG. 15, the sacrifice layer 73 is removed by performing a wet etching via the slit 78. For example, in the case of forming the sacrifice layer 73 of silicon nitride, phosphoric acid is used for etchant of the wet etching, and thermos-phosphoric acid is used for processing. A cavity 79 is formed by removing the sacrifice layer 73 via the slit 78. Subsequently, a conductive layer including tungsten or molybdenum or the like is deposited via the slit 78 to be buried in the cavity 79. Thereby, the electrode layer 17 is formed. The sacrifice layer 73 is replaced with the electrode layer 17, and the stacked body 15 is formed between the slits 78 extending in the Y-direction.

Figure 16:
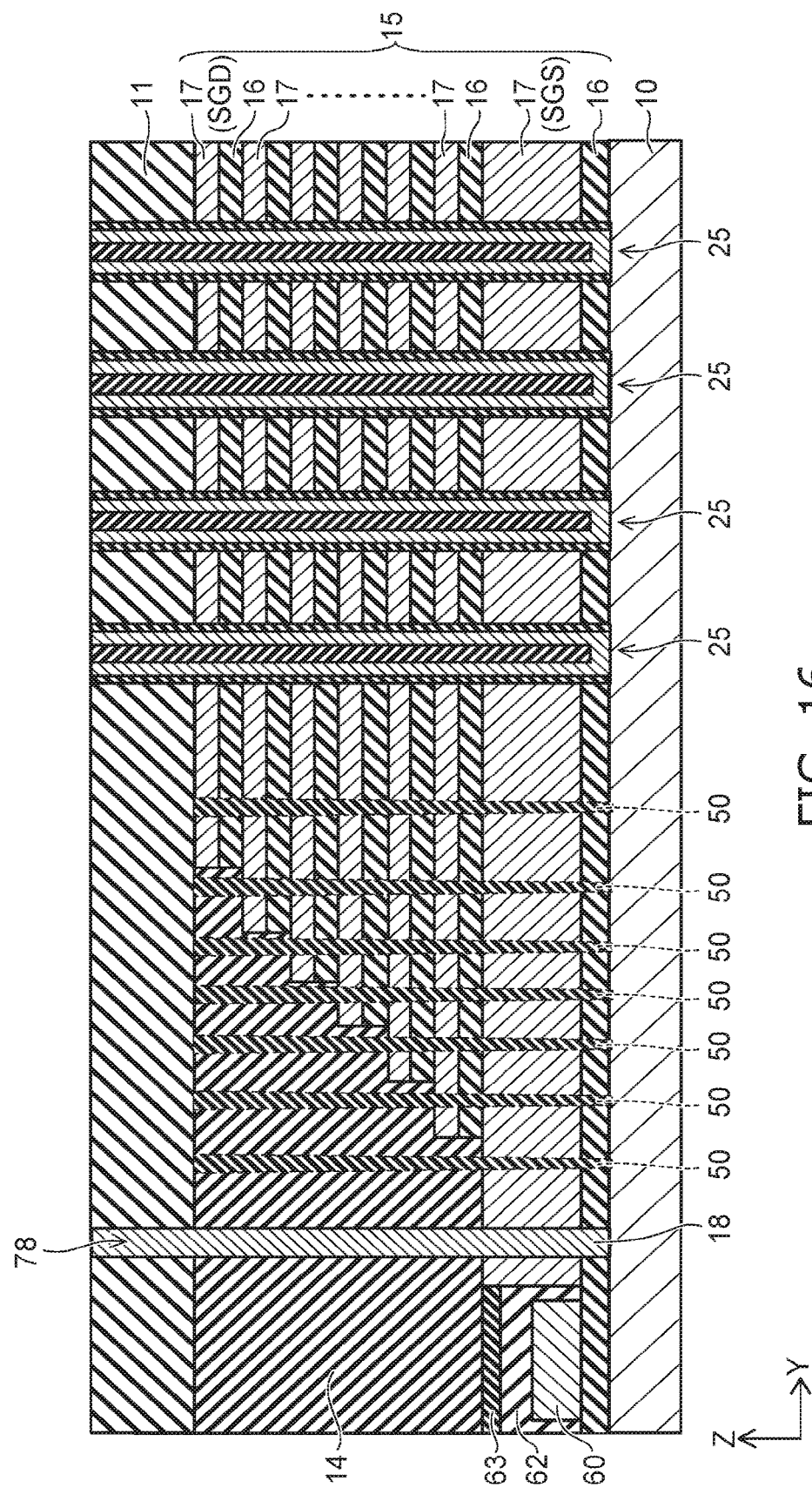

Next, as shown in FIG. 16, silicon oxide is deposited all over to form an insulating layer, and then the side wall 19 is formed by etching back the insulating layer and leaving the insulating layer on a side surface of the slit 78. Subsequently, a conductive layer is formed by depositing tungsten or molybdenum to be thick. Thereby, the interconnection portion 18 is formed in the slit 78.

Thereafter, in the memory cell region Rm, after a contact hole is formed in a region directly above the columnar portion 25 and in the insulating layer 12, the contact portion 35 is formed by burying a metal material in the contact hole.

Subsequently, after a contact hole is formed in a region directly above the contact portion 35 and in the insulating layer 13, the contact portion 36 is formed by burying a metal material in the contact hole. The contact portion 35 and the contact portion 36 are formed by, for example, the photolithography method and etching. Subsequently, the bit lines 40 extending in the X-direction are formed by forming a conductive layer on the insulating layer 13 and patterning the conductive layer using RIE or the like.

On the other hand, in the contact region Rc, a contact hole is formed in a region directly above the step 17s of the electrode layer 17. Subsequently, the contact portion 37 is formed in the contact hole by burying a metal material in the contact hole. Thereafter, the upper-layer word line 41 connected to the contact portion 37 is formed.

In this manner, the semiconductor memory device 1 according to the embodiment is manufactured.

Hereinafter, the effects of the embodiment will be described.

Figure 17:
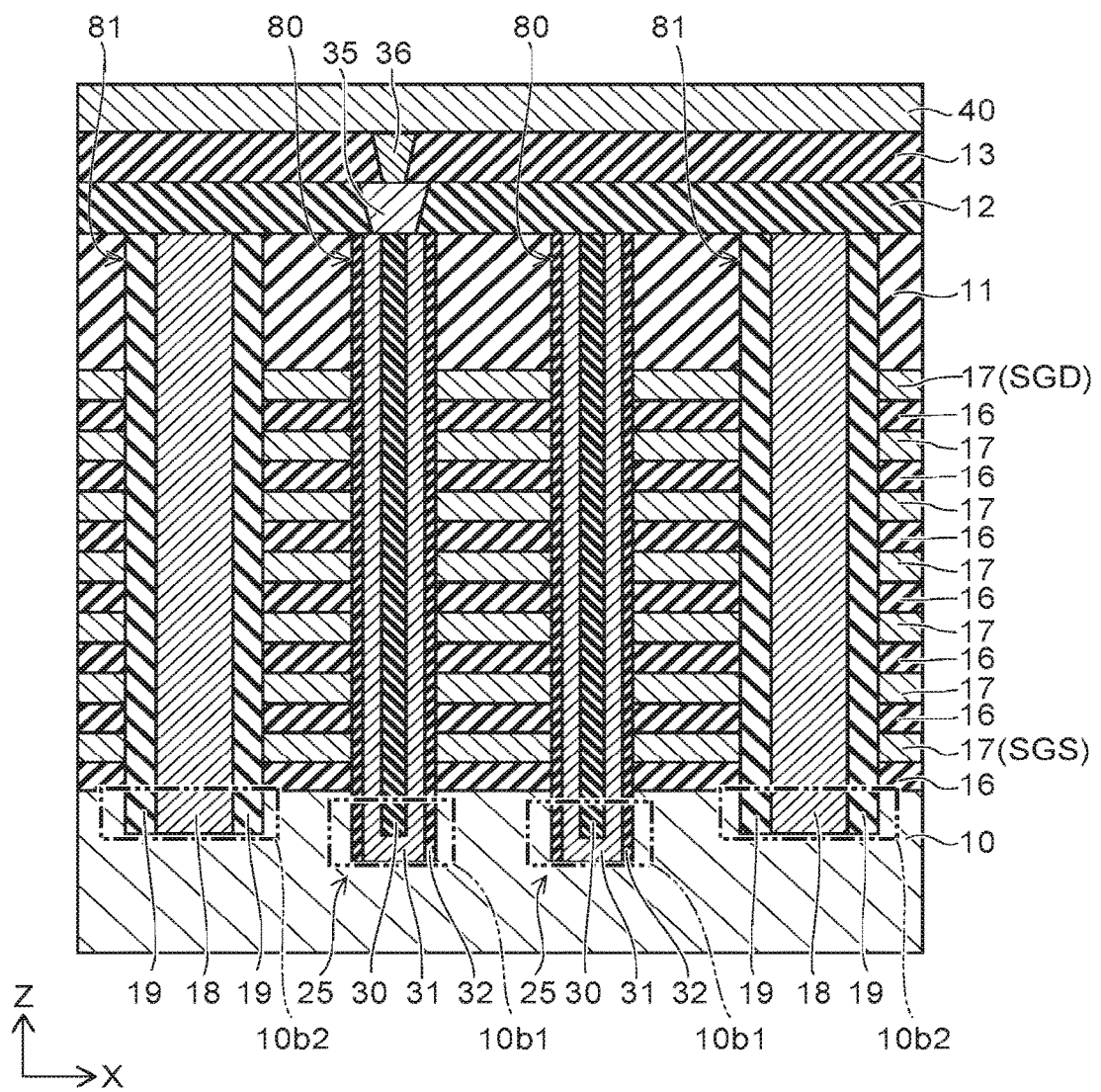
FIG. 17 is a cross-sectional view showing a part of a semiconductor memory device according to a reference example.

FIG. 17 is a cross-sectional view showing a part of a semiconductor memory device according to a reference example. FIG. 17 shows a X-Z cross-sectional view along the line B1-B2 in FIG. 1, as the cross-sectional view of FIG. 3.

In the embodiment, the lowermost electrode layer 17 (the source side selection gate SGS) in the electrode layers 17 of the stacked body 15 includes polycrystalline silicon, and the thickness thereof is greater than the thickness of other electrode layer 17. When the electrode layers 17 are stacked in the stacked body 15 like this, by forming the hole 75 so as not to pierce the source side selection gate SGS, and then performing the etching again to pierce between the source side selection gate SGS and the substrate 10, the memory hole MH can be formed in the stacked body 15a. That is, it is possible to form the memory hole MH as shown in FIG. 11 to FIG. 13. Thereby, it is possible to suppress the substrate 10 from being largely engraved.

In the 3-dimensional structure semiconductor memory device, the memory hole is formed in the stacked body by the etching. Due to the increase in the number of the electrode layers stacked, an aspect ratio of the memory hole is likely to being large. That is, the memory hole is likely to be formed so as to be long in a stacking direction. In the case where the memory hole is formed so as to be long in the stacking direction, there is a possibility that it is difficult to stop the etching at the lower layer of the stacked body depending on an etching condition (for example, RIE condition of high acceleration), thereby largely engraving the substrate.

For example, as shown in FIG. 17, when a memory hole 80 is formed such that the substrate 10 is largely engraved, a cavity 10b1 corresponding to a part of the memory hole 80 is formed in the substrate 10. When the columnar portion 25 is formed in the memory hole 80 having the cavity 10b1, it is difficult to form the columnar portion 25 (the semiconductor layer 31) on a side surface of the cavity 10b1 by an electric field generated from the lowermost electrode layer 17 (the source side selection gate SGS). Thereby, a flow of a current is made harder from the interconnection portion 18 to the semiconductor layer 31 of the columnar portion 25 via the substrate 10.

There may be a case that the engraving of the substrate 10 is eliminated by burying silicon in the cavity 10b1 of the substrate 10 using an epitaxial growth method or the like. However, in the case where the memory hole 80 is formed by performing a process for burying silicon, there is a possibility that the cost of a process for forming the memory hole 80 is increased, thereby increasing the cost of manufacturing the semiconductor memory device.

In the embodiment, the source side selection gate SGS including polycrystalline silicon, in which the thickness is greater than the thickness of other electrode layer 17, functions as a layer for stopping the etching. Therefore, it is possible to suppress from largely engraving the substrate. Thereby, the columnar portion 25 is likely to be formed in the memory hole MH, and a flow of a current is made easier from the interconnection portion 18 to the semiconductor layer 31 of the columnar portion 25. Therefore, it is possible to suppress problems from being generated in the memory cell by making a flow of a current harder from the interconnection portion 18 to the semiconductor layer 31.

Since the cost of the process for depositing polycrystalline silicon as shown in FIG. 6 to FIG. 8 is lower as compared with the cost of the process for burying silicon so as to eliminate the engraving of the substrate 10, it is possible to suppress from increasing the cost of manufacturing the semiconductor memory device.

In the above-mentioned embodiment, the effects of a portion of forming the columnar portion 25 (the semiconductor layer 31) in the memory hole MH are described. However, it is possible to obtain the same effects on a portion of forming the interconnection portion 18 in the slit 78.

For example, as shown in FIG. 17, when a slit 81 is formed such that the substrate 10 is largely engraved, a cavity 10b2 corresponding to a part of the slit 81 is formed in the substrate 10. It is difficult to form the interconnection portion 18 on a side surface of the cavity 10b2 by an electric field generated from the lowermost electrode layer 17 (the source side selection gate SGS). Thereby, a flow of a current is made harder from the interconnection portion 18 to the semiconductor layer 31 of the columnar portion 25 via the substrate 10.

On the other hand, the source side selection gate SGS can be used as a layer for stopping the etching in the process for forming the slit 78 as shown in FIG. 14. That is, as the process for forming the memory hole MH in FIG. 11 to FIG. 13, the slit 78 can be formed stepwise. Thereby, it is suppressed the substrate 10 from being largely engraved by the slit 78, the interconnection portion 18 is likely to be formed in the slit 78, and a flow of a current is made easier from the interconnection portion 18 to the semiconductor layer 31 of the columnar portion 25. Therefore, it is possible to suppress problems from being generated in the memory cell by making a flow of a current harder from the interconnection portion 18 to the semiconductor layer 31.

According to the embodiment described above, the semiconductor memory device and the method for manufacturing the same suppressing problems from being generated in the memory cell can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a base;
a stacked body including a first insulating layer provided on the base, a first electrode layer provided on the first insulating layer and including polycrystalline silicon, a second insulating layer provided on the first electrode layer, and a second electrode layer provided on the second insulating layer; and
a columnar portion including a semiconductor layer extending in a stacking direction of the stacked body and a memory layer provided between the semiconductor layer and at least the second electrode layer, a lower end of the semiconductor layer contacting the base,
the first and second electrode layers respectively having a first thickness and a second thickness in the stacking direction,
the first thickness of the first electrode layer being thicker than the second thickness of the second electrode layer, and
the first electrode layer including a first layer including the polycrystalline silicon and a second layer including a metal or a metal compound.

2. The semiconductor memory device according to claim 1, wherein the first thickness is three times or more thicker than the second thickness.

3. The semiconductor memory device according to claim 1, wherein the first electrode layer includes boron or phosphorus.

4. The semiconductor memory device according to claim 1, wherein
the stacked body further includes a plurality of third insulating layers and a plurality of third electrode layers alternately stacked one layer by one layer on the second electrode layer, and
the first thickness is greater than the thickness of each of the third electrode layers.

5. The semiconductor memory device according to claim 4, wherein
the first thickness is three times or more thicker than the second thickness, and
the first thickness is three times or more thicker than the thickness of each of the third electrode layers.

6. The semiconductor memory device according to claim 1, wherein the second layer is provided on the first layer.

7. The semiconductor memory device according to claim 6, wherein the second layer includes tungsten or molybdenum.

8. The semiconductor memory device according to claim 6, wherein
the first and second layers respectively have a third thickness and a fourth thickness in the stacking direction, and
the third thickness of the first layer is thicker than the fourth thickness of the second layer.

9. The semiconductor memory device according to claim 1, wherein the first electrode layer is a source side selection gate.

10. The semiconductor memory device according to claim 1, wherein the second electrode layer includes tungsten or molybdenum.

11. The semiconductor memory device according to claim 1, further comprising:
an interconnection portion provided in the stacked body and extending in the stacking direction and a first direction crossing the stacking direction,
wherein a lower end of the interconnection portion contacts an upper surface of the base.

12. The semiconductor memory device according to claim 11, wherein an end portion of the stacked body is a stepped shape so as to form a step for each of the electrode layers, and
the first electrode layer is positioned in a first region and a second region, the columnar portion being disposed in the first region, the steps being forming in the second region, and the second region being adjacent to the first region in the first direction.

13. The semiconductor memory device according to claim 12, further comprising:
a switching element provided on the first insulating layer; and
a fourth insulating layer provided on the switching element,
wherein the switching element and the fourth insulating layer is positioned in a third region, the third region being adjacent to the second region in the first direction,
the first electrode layer has a first surface opposite to the second insulating layer in the first region,
the fourth insulating layer has a second surface opposite to a surface facing the switching element in the third region, and
the first and second surfaces are substantially positioned on a same plane.

14. The semiconductor memory device according to claim 1, wherein the memory layer includes a fifth insulating layer provided on a side surface of the semiconductor layer, a charge storage layer provided on a side surface of the fifth insulating layer, and a sixth insulating layer provided on a side surface of the charge storage layer.

* * * * *